United States Patent [19]
Hsu et al.

[11] Patent Number: 5,930,178
[45] Date of Patent: Jul. 27, 1999

[54] BITLINE VOLTAGE STABILIZATION DEVICE AND METHOD

[75] Inventors: Louis Lu-Chen Hsu, Fishkill; Jack Allan Mandelman, Stormville; Matthew Robert Wordeman, Mahopac, all of N.Y.

[73] Assignee: International Business Machines Corporation, Armonk, N.Y.

[21] Appl. No.: 08/971,494

[22] Filed: Nov. 17, 1997

[51] Int. Cl.$^6$ .................................................... G11C 16/04
[52] U.S. Cl. ............... 365/189.06; 365/196; 365/230.02
[58] Field of Search ............................. 365/189.06, 149, 365/207, 201, 203, 230.02, 196

[56] References Cited

U.S. PATENT DOCUMENTS

| | | | |
|---|---|---|---|
| 5,053,997 | 10/1991 | Miyamato et al. ................ | 365/180.06 |
| 5,091,889 | 2/1992 | Hamano et al. ................... | 365/233.5 |
| 5,093,808 | 3/1992 | Foss ................................... | 365/203 |
| 5,416,371 | 5/1995 | Katayama et al. ................. | 327/57 |
| 5,487,044 | 1/1996 | Kawaguchi et al. ............... | 365/203 |
| 5,537,359 | 7/1996 | Toda .................................. | 365/222 |
| 5,640,355 | 6/1997 | Muraoka et al. .................. | 365/207 |
| 5,659,512 | 8/1997 | Koyanagi et al. ................. | 365/203 |
| 5,732,033 | 3/1998 | Mullarkey et al. ................ | 365/201 |

OTHER PUBLICATIONS

M. Asakura et al., "An Experimental 256–Mb DRAM with Boosted Sense–Ground Scheme", IEEE Journal of Solid–State Circuits, vol. 29, No. 11, Nov. 1994.

T. Ooishi et al., "An Automatic Temperature Compensation of Internal Sense Ground . . . ", IEEE Journal of Solid–State Circuits, vol. 30, No. 4, Apr. 1995.

S. H. Dhong et al., "Low–Power Sensing Scheme with a Limited Bit–line Swing and Bit–Line Multiplexing", IBM Technical Disclosure Bulletin, vol. 34, No. 9, Feb. 1992, pp. 449–450.

*Primary Examiner*—David Nelms
*Assistant Examiner*—Thong Le
*Attorney, Agent, or Firm*—Daryl K. Neff, Esq.

[57] ABSTRACT

A voltage control circuit for maintaining voltage levels on a pair of bitlines at a desirable above ground voltage is disclosed herein. In an exemplary embodiment, a semiconductor storage device includes a plurality of pairs of bitlines; a p-type field effect transistor multiplexer (PMUX) connecting each bitline of the pair to a sense amplifier; and a clamping circuit which prevents voltage levels on the bitlines from dwelling below a predetermined minimum voltage level. A method is also disclosed herein in which voltage levels on a pair of bitlines are maintained at a desirable above ground voltage level by connecting each bitline of a pair to a sense amplifier through a p-type field effect transistor multiplexer (PMUX); and clamping each bitline to prevent the voltage level thereon from dwelling below a predetermined minimum voltage level.

22 Claims, 10 Drawing Sheets

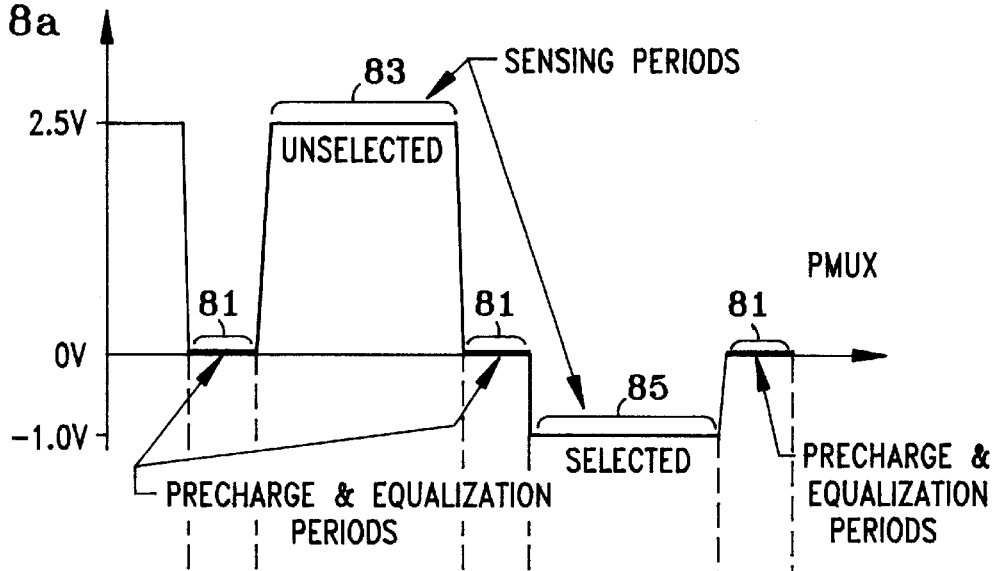
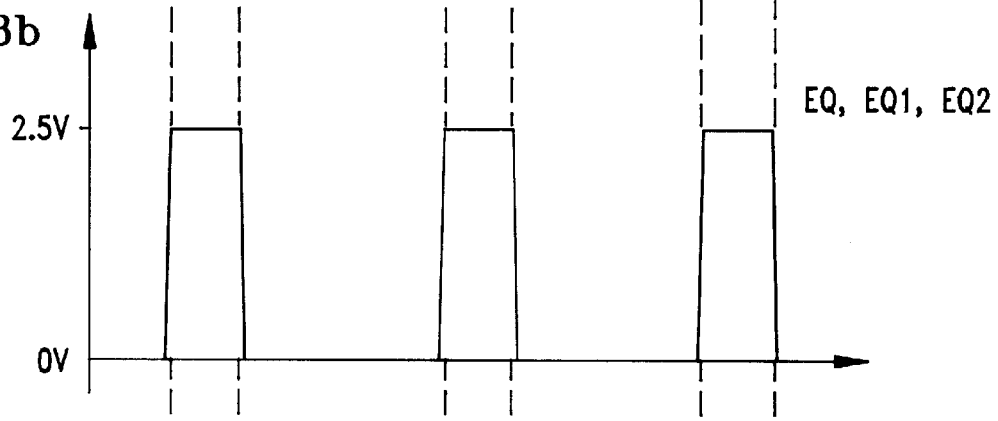
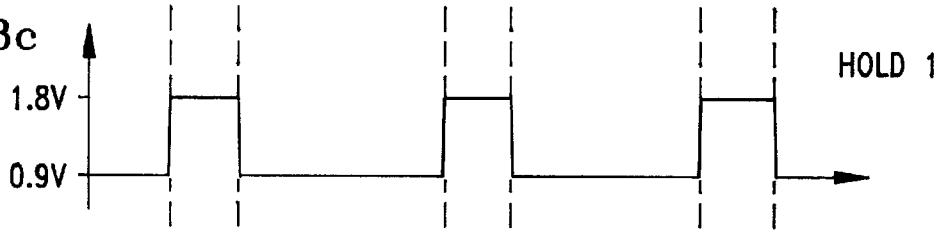
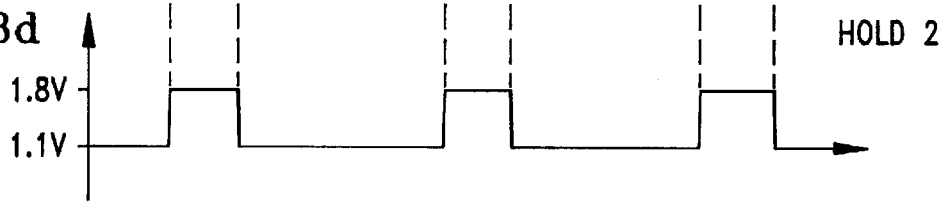
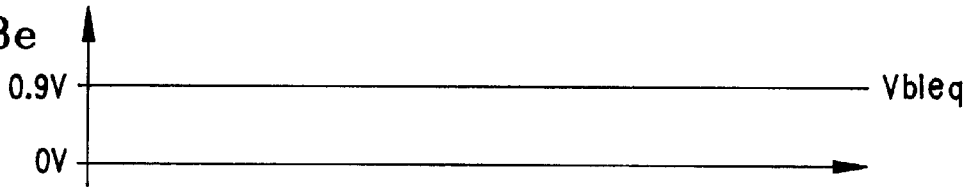

BITLINE VOLTAGE STABILIZATION DEVICE AND METHOD

FIELD OF THE INVENTION

The present invention relates to memory devices and more specifically to support circuitry associated with integrated circuit memory arrays.

BACKGROUND OF THE INVENTION

Memory array designers have found it advantageous to incorporate PFET MUXes (PMUXes) between precharge equalization circuits and sense amplifiers on bitlines of NFET memory arrays in order to raise the voltage of the bitline low level above ground voltage level. Raising the bitline low voltage level places the NFET access transistors of the memory array deeper into the cutoff region below the threshold voltage, which in turn reduces subthreshold leakage currents and advantageously affects the retention time of the memory array.

However, the incorporation of PMUXes in this manner has not uniformly resulted in increased memory retention time. Nonselected bitlines assume floating voltage levels during sensing intervals. Such floating voltage levels are subject to downward shifts during sensing intervals due to capacitive coupling of signals from adjacent selected bitlines. Because of such lowering of the bitline low voltage level, the subthreshold leakage current for access transistors of cells served by that bitline increases by orders of magnitude, seriously affecting the retention time for data stored in those cells. Considering that the PMUX cannot restore the voltage level on such bitlines to the desirable above ground voltage level, this coupling effect is understood to be a serious problem. Moreover, existing precharge and equalization circuits do not address this problem.

In the description below, reference is made to the drawings herein, the description of which is as follows:

BRIEF DESCRIPTION OF THE DRAWINGS

FIGS. 8a–8e are waveforms illustrating the voltage level inputs to PFET multiplexers and circuit elements included in preferred embodiments of the invention.

FIG. 1 is a circuit diagram showing elements of a semiconductor memory cell having an NFET type access transistor 10 as a transfer device. An above zero voltage level, for example 0.3V, is applied as a low voltage level to a bitline BL when the bitline BL is not being precharged or read or written to, i.e. as the default low voltage level of the bitline. When the wordline voltage applied at the gate of the transfer device remains at a default low level of 0 V, the above zero voltage level of the bitline maintains the NFET transfer device in deep cutoff. Specifically, at the 0.3 V low voltage level of the bitline, the transfer device is biased with a source voltage $V_S$ of 0.3 V, and a gate voltage $V_g$ of 0.0 V such that the NFET is biased at a voltage $V_{gs}-V_T=-0.3-0.5=-0.8$ V, which places the NFET transfer device in deep cutoff. As shown in FIG. 2, the amount of subthreshold current $I_{ds}$ which passes the access transistor when the bitline voltage level is raised to 0.3 V ($V_{gs}=-0.3$ V) is 100 times smaller ($10^{-12}$) at that bias point than the amount of current ($10^{-10}$) when the bitline low voltage level remains at 0.0 V.

FIG. 3 is a schematic diagram showing the precharge, equalization, and support circuitry for a semiconductor memory array having PFET multiplexers 12 in which bitlines are permitted to float between precharge intervals. As shown in FIG. 3, a PFET multiplexer (PMUX) 12 is placed on each bitline BL, BL' of a complementary pair, in series between a sense amplifier 14 and the memory array 16 having precharge/equalization circuitry 20.

FIG. 8A shows an example of a voltage waveform applied to the gate of PMUXes 12. The PMUXes 12, being P-type field effect transistors (PFETs), have a negative threshold voltage such that they do not fully turn on until the gate source voltage $V_{gs}$ is driven below −0.65 V. As indicated in FIG. 8a, during periodic precharge/equalization intervals, the voltage applied to the gate of PMUXes 12 is held at zero volts. Otherwise, unless the particular bitline has been selected for a read or write operation, for example, by a column address selector (not shown), the voltage applied to the gate of PMUXes 12 is maintained at 2.5 V. As indicated in FIG. 8a, when a particular bitline is selected for a read or write operation, a boosted gate voltage of −1 V is applied to the gate of the PMUX 12 connected to that bitline, which turns on that PMUX 12, allowing the bitline voltage level from the memory array 16 to be sensed in sense amplifier 14.

Conversely, whenever the gate voltage applied to PMUXes 12 is above zero volts, for example at 2.5 V, the PMUXes 12 electrically isolate the bitlines in the memory array 16 from the sense amplifier 14, thereby permitting the voltage levels on the bitlines to float, nominally at $V_{TP}$, the above ground threshold voltage of the PMUXes 12.

Figure 4A:
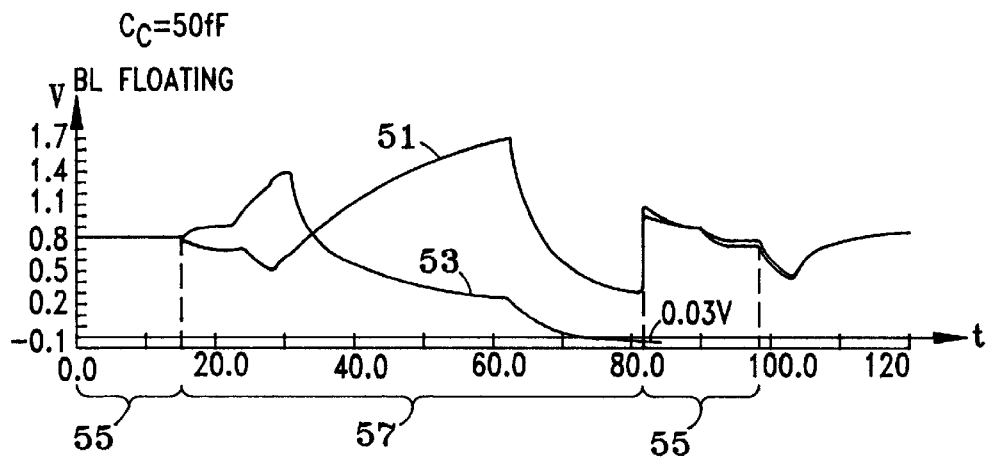
FIGS. 4a–4b illustrate dynamically a downward coupled change in the voltage level of an unclamped bitline which is capacitively coupled to an adjacent downward transitioning bitline, for different values of adjacent bitline coupling capacitance.
Figure 4B:
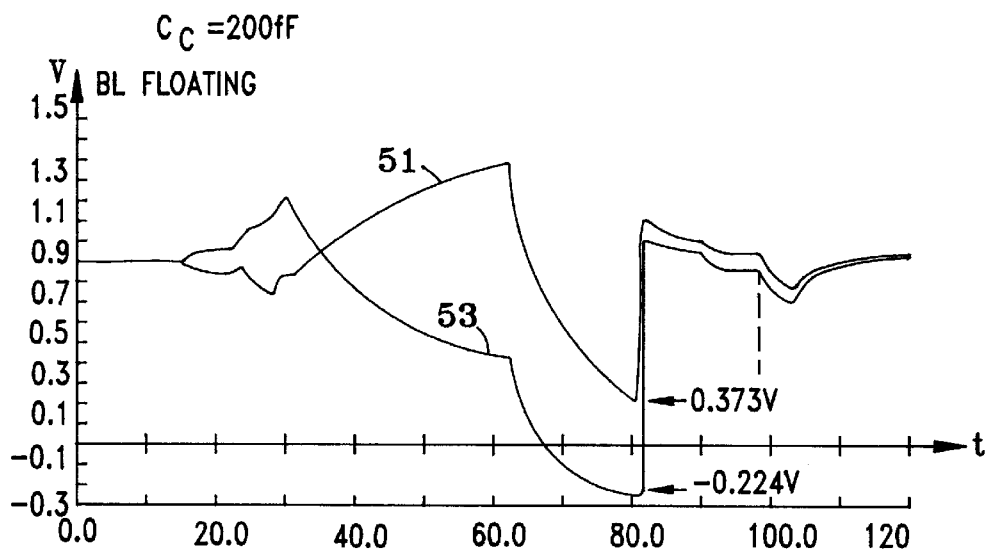
Figure 4C:
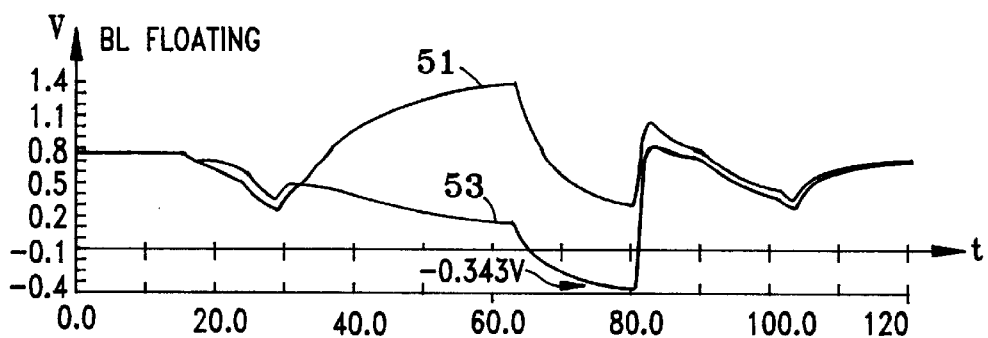
FIG. 4c illustrates dynamically a downward coupled change in the voltage level of an unclamped bitline which is capacitively coupled to an adjacent downward transitioning bitline, when higher than normal bitline leakage current is present.

However, it has been found that permitting the voltage levels on bitlines to float in this manner adversely affects the operation of the semiconductor memory integrated circuit (IC). So long as the low voltage level on a bitline does not fall below 0.3 V, NFET access transistors of memory cells connected to the bitline remain deeply in cutoff with the relationship $V_{gs}-V_T$ being maintained at approximately –0.9 V. FIGS. 4a, 4b, and 4c illustrate dynamically the changing voltage waveforms 51, 53 for a current, i.e. selected, bitline and an adjacent nonselected bitline, respectively, for three different conditions. FIG. 4a is a graph showing the time-varying voltage levels on a selected or "current" bitline and on an adjacent nonselected bitline for the case in which the coupling capacitance between these bitlines is about 50 femtoFarads (fF). As indicated in FIG. 4a, during precharge intervals 55, the voltage level on each bitline is brought to a level of about 0.9 V. Thereafter, during a sensing interval 57 when a low voltage level of approximately 0.3 V is being written to a cell from the bitline over a previously stored high voltage level, a deleterious effect is observed in the voltage level 53 of the adjacent nonselected bitline being coupled downward. During such sensing interval 57, when the voltage level 51 of the current bitline is driven down towards the nominal bitline low voltage level of 0.3 V, coupling capacitance between the current bitline and the adjacent bitline causes the floating voltage level 53 on the adjacent bitline to be driven below the nominal bitline low voltage level of 0.3 V.

Figure 1:
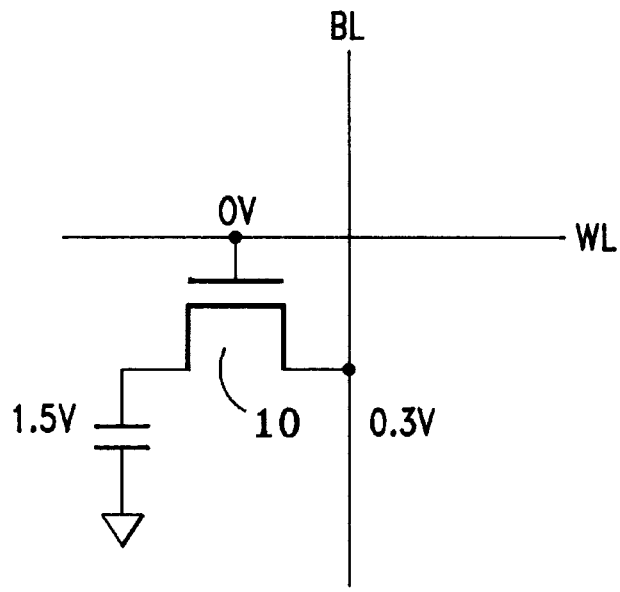
FIG. 1. is a schematic diagram showing a semiconductor memory cell and voltage levels applied to circuit elements thereof for the case when a wordline WL thereof is not selected.
Figure 2:
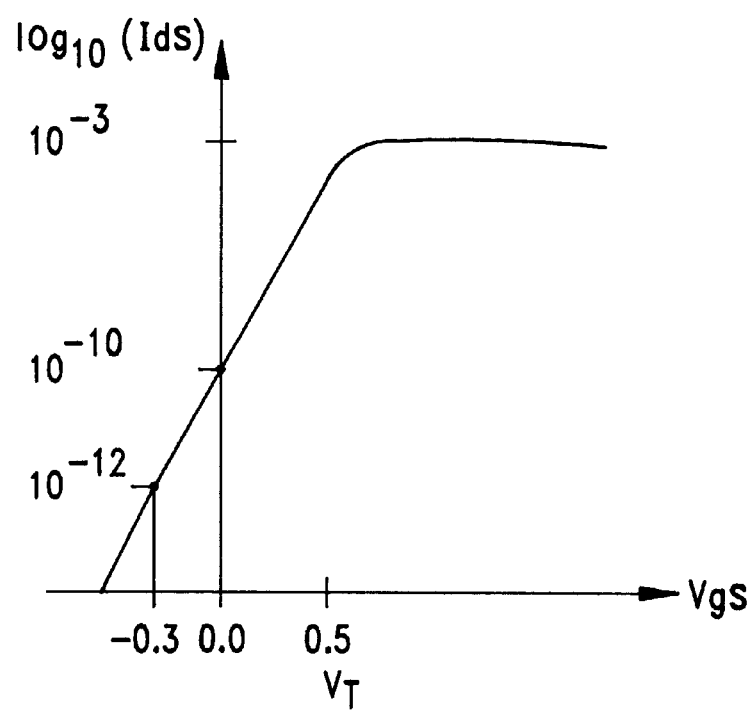
FIG. 2 is a graph representing the current voltage characteristic of an NFET type access transistor used in a semiconductor memory cell.
Figure 3:
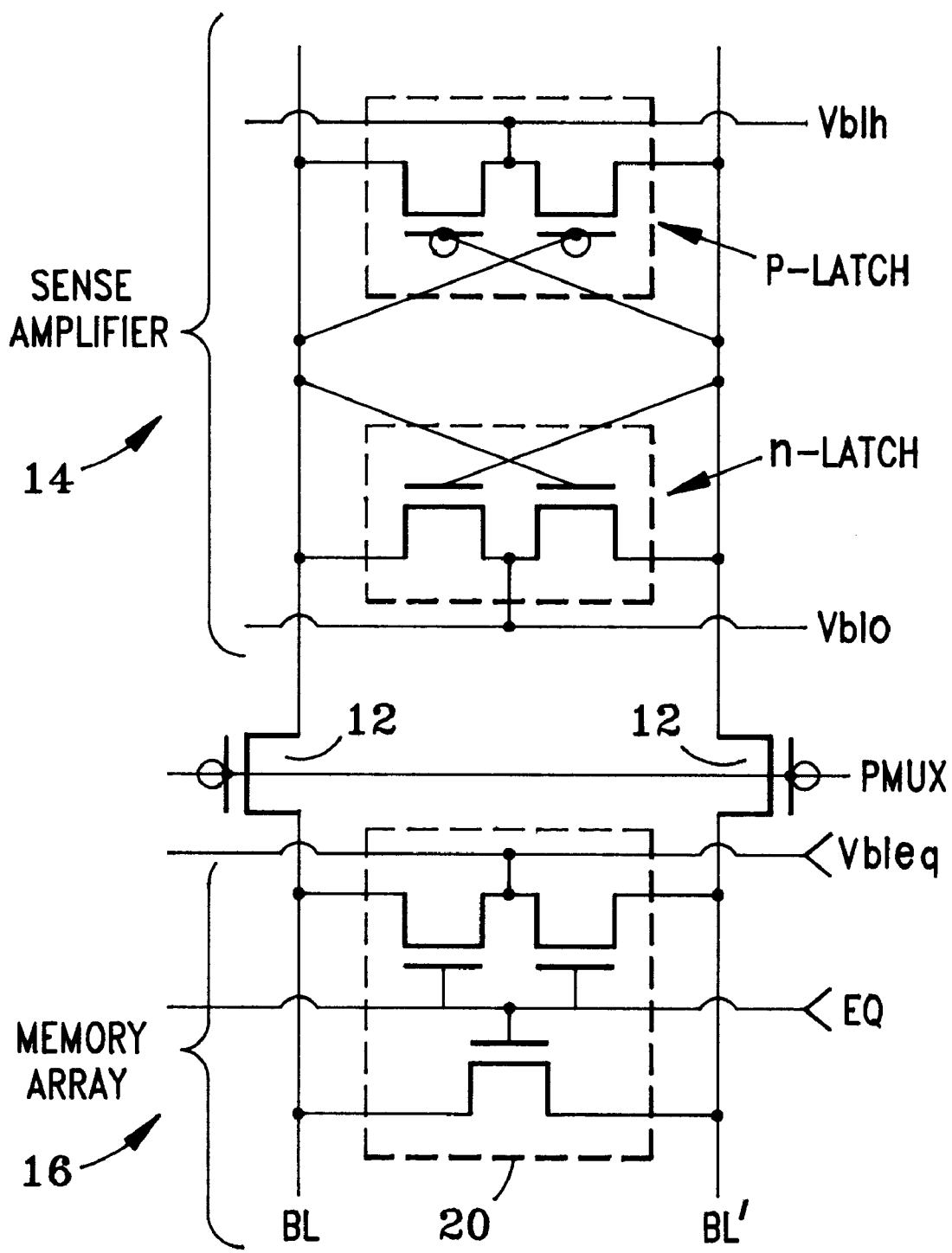
FIG. 3 is a schematic diagram showing the precharge, equalization, and support circuitry for a semiconductor memory array having PFET multiplexers and floating bitlines.

For the circuit shown in FIG. 3, wherein the threshold voltage $V_T$ for the NFET transistors is 0.6 V and for the PMUX is 0.65 V, and the coupling capacitance between bitlines is 50 fF, the adjacent bitline voltage level was observed to fall to about 0.03 V. At that value, $V_{gs}-V_T=-0.63$ V such that the low voltage level of the bitline is not sufficiently high to stop NFET access transistors of memory cells served by the bitline from leaking charge stored on cell capacitors onto the bitline.

In FIG. 4b, the same conditions as above apply except that the coupling capacitance between bitlines is 200 fF. Under those conditions, the adjacent bitline voltage level 53 was observed to fall to –0.22 V such that $V_{gs}-V_T$ becomes –0.38 V, causing NFET access transistors connected to the bitline to rapidly leak charge stored on cell capacitors onto the bitline.

Figure 5:
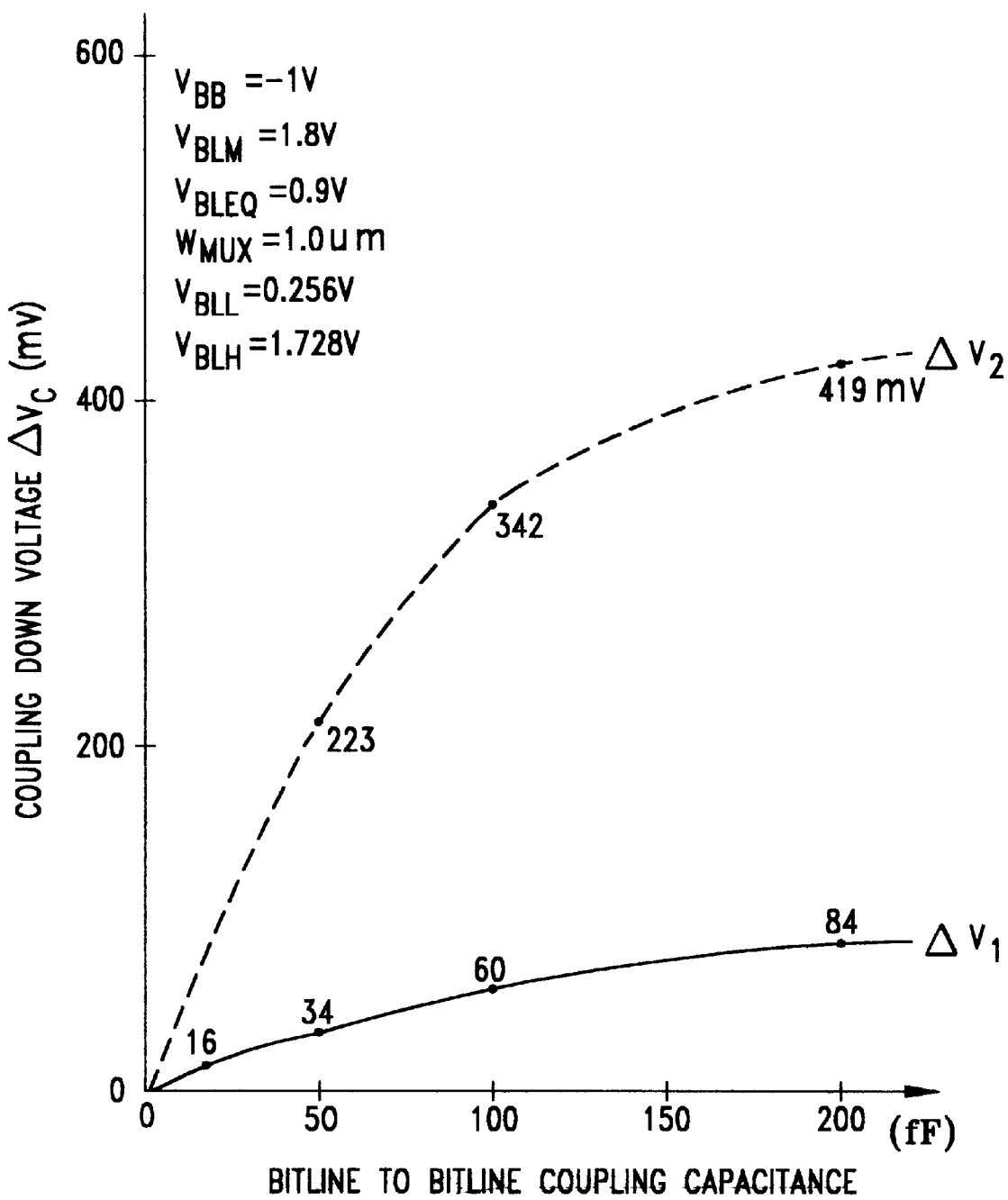
FIG. 5 is a graph showing the relationship between adjacent bitline coupling capacitance and downward coupled change in the voltage level of an adjacent unclamped bitline for different values of coupling capacitance.

FIG. 5 is a graph summarizing the relationship between quantity of coupling capacitance between adjacent bitlines and the change in voltage by which the nonselected adjacent bitline is driven below the 0.3 V nominal bitline voltage for two different operations. When the current bitline is used to perform a writeback operation, i.e. a "read-modify-write" operation, the data in a memory cell is first read, and then rewritten to opposite polarity, all during the same sensing interval. When the data read from the cell is represented by a high voltage level and then rewritten to a low voltage level, a large voltage swing occurs. Because of capacitive coupling, the large voltage swing on the current bitline is coupled onto the adjacent nonselected bitline, which bitline is electrically isolated for voltage levels below 0.3 V. In FIG. 5, ΔV2 represents the downward coupled change in the voltage level on the nonselected bitline which occurs during such writeback cycle.

The value ΔV1 represents the downward coupled change in the voltage level on a nonselected bitline which results for a somewhat different condition. ΔV1 represents the value by which the nonselected bitline is coupled downward when that bitline is transitioning to a low voltage level at the same time that an adjacent selected bitline is being driven down to a low voltage level. For example, this condition occurs when the nonselected bitline is a bitline BLa' of a pair BLa, BLa', in which bitline BLa is selected and transitioning to a high voltage level, at the same time in which bitline BLb, adjacent to bitline BLa', is selected and transitioning to a low voltage level.

FIG. 4c illustrates a somewhat different condition in which, due to various mechanisms, a leakage path exists for current to pass from a nonselected bitline to the semiconductor substrate at a p-type well therein. The leakage path is modelled as a linear resistance of 500 kilo-ohm between the bitline and the p-well (which is held at a constant voltage of –1 V). In FIG. 4c, curve 53 indicates the change in voltage by which the nonselected bitline is coupled downward when the selected bitline is used to perform a writeback operation as described above, i.e. to first read a stored high voltage level, then to write a low voltage level over the previously stored high voltage level, during a single sensing interval. As shown in FIG. 4c, for that level of leakage current and adjacent bitline coupling capacitance of 50 fF, the voltage level on the nonselected bitline is coupled downward to about –0.34 V. At such voltage level of the bitline, the value $V_{gs}-V_T$ for NFET access transistors coupled to the bitline becomes –0.26 V, which even more closely approaches the full turn on value (zero volts). Under such condition, the downward change in the voltage of the nonselected bitline will cause charge stored in cell capacitors connected to the bitline exceed all acceptable limits.

Accordingly, it is an object of the present invention to provide a bitline stabilization device which clamps the voltage on a bitline at a predetermined minimum voltage level, thereby preventing the voltage level from dwelling below the predetermined voltage level.

Another object of the invention is to provide a bitline stabilization device which, in addition to clamping bitline voltages, utilizes the same circuitry to perform the precharge function.

Still another object of the invention is to provide a bitline stabilization device which clamps the voltage level on a bitline at an externally referenced minimum voltage level.

SUMMARY OF THE INVENTION

These and other objects are provided by the bitline stabilization device and method of the present invention. Accordingly, in a first embodiment, a semiconductor storage device includes a plurality of pairs of bitlines; a p-type field effect transistor multiplexer (PMUX) coupling each bitline of the pair to a sense amplifier; and a clamping circuit coupled to each bitline of the pair for preventing voltage levels on the bitlines from dwelling below a predetermined minimum voltage level.

Preferably, the clamping circuit receives a supply voltage and drives voltage levels on said bitlines to a precharge voltage level in response to a change in the supply voltage. Preferably, the semiconductor storage device further includes an equalization circuit which stabilizes voltage levels on the bitlines to a single precharge voltage level during precharge intervals.

The invention is also embodied in a method of controlling voltage levels on a pair of bitlines of a semiconductor storage device, including the steps of coupling each bitline of the pair to a sense amplifier through a p-type field effect transistor multiplexer (PMUX); and clamping each bitline of the pair to prevent voltage levels on said bitlines from dwelling below a predetermined minimum voltage level. Preferably, the method includes a step of driving voltage levels on the bitlines to a precharge voltage level during precharge intervals. In addition, the method preferably includes equalizing voltage levels on the bitlines to a single precharge voltage level during precharge intervals.

DETAILED DESCRIPTION OF THE PREFERRED EMBODIMENTS

Figure 6A:
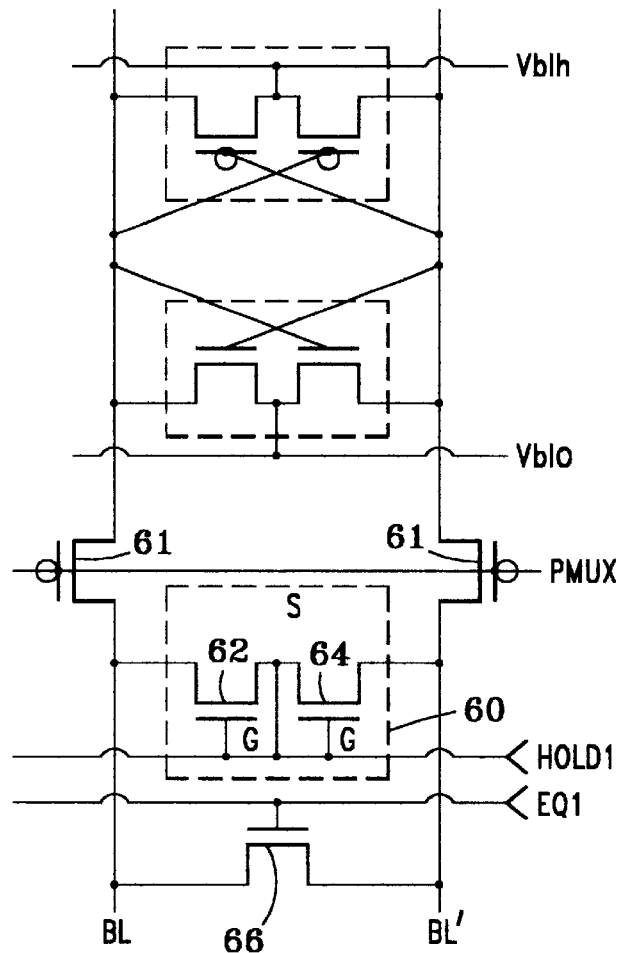
FIGS. 6a–6d are schematic circuit diagrams showing different implementations of a first embodiment of the present invention.

The clamping circuit of the present invention corrects for the above-described capacitive coupling between bitlines and bitline to substrate leakage by clamping the low-going range of the bitline voltage at 0.3 V. As shown in FIG. 6a, in a first embodiment of the invention, a clamping circuit 60 includes a pair of switches, for example NFETs 62 and 64 tied together at their source and gate terminals, such that NFETs 62 and 64 are biased together in a configuration of back-to-back semiconductor diodes. The device characteristics of the NFETs 62 and 64 are selected such that substantial current flows when NFETs 62, 64 are biased for conduction when a voltage greater than the NFET threshold voltage $V_{TN}$ (approximately +0.6 V) is applied between their gate terminals, which are tied to the source terminals, and their drain terminals, which are coupled to bitlines BL, BL'. Thus, NFETs 62, 64 conduct current to bitlines BL and BL' when NFETs 62, 64 are biased for conduction by the HOLD1 waveform exceeding the voltage level present on bitlines BL and BL' by at least $V_{TN}$, i.e. by +0.6 V.

Equalization is performed by an equalization switch, for example an NFET 66, having source and drain terminals coupled to respective bitlines BL and BL', and a gate terminal coupled to receive a voltage waveform EQ1.

Figure 6B:
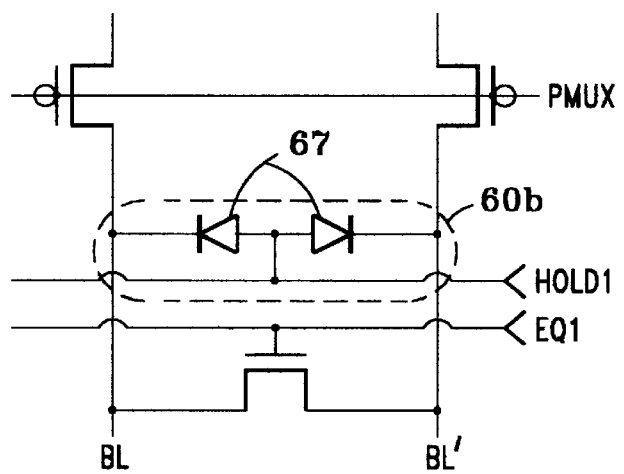

FIG. 6b is a schematic diagram showing an alternative implementation of this first embodiment of the invention. In this embodiment, a clamping circuit 60b is implemented with a pair of semiconductor diodes 67 closely matched in characteristics, in place of NFETs 62 and 64 of clamping the circuit 60 of the embodiment shown in FIG. 6a. Since the HOLD1 waveform is applied at the p-terminals of diodes 67, and the n-terminals of diodes 67 are connected to respective bitlines BL and BL', it will be understood that the voltage levels on bitlines BL and BL' will remain clamped at a minimum level $V_{HOLD1}-V_D$, where $V_D$ is the turn-on voltage of diodes 67, approximately 0.6 V.

Figure 6C:
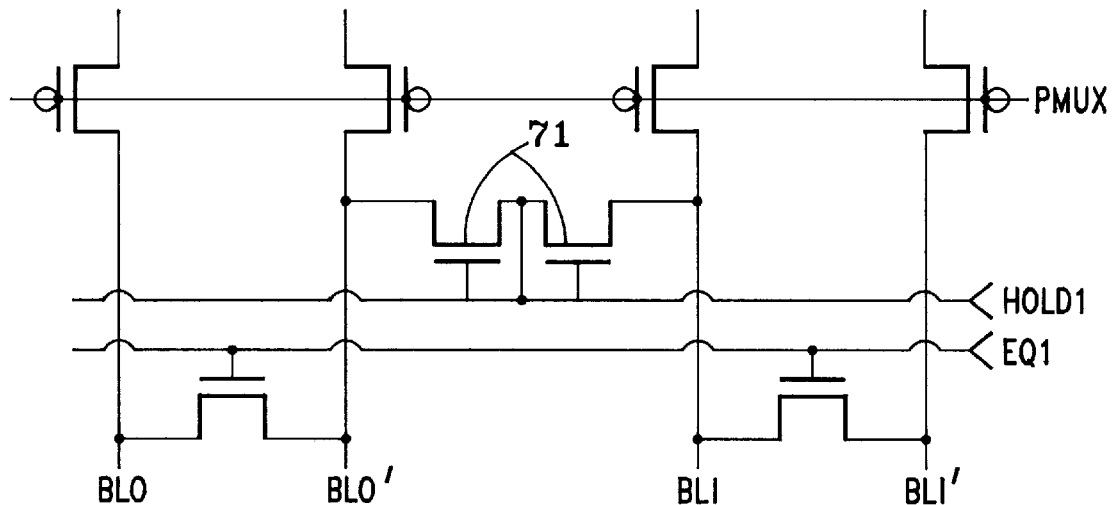
Figure 6D:
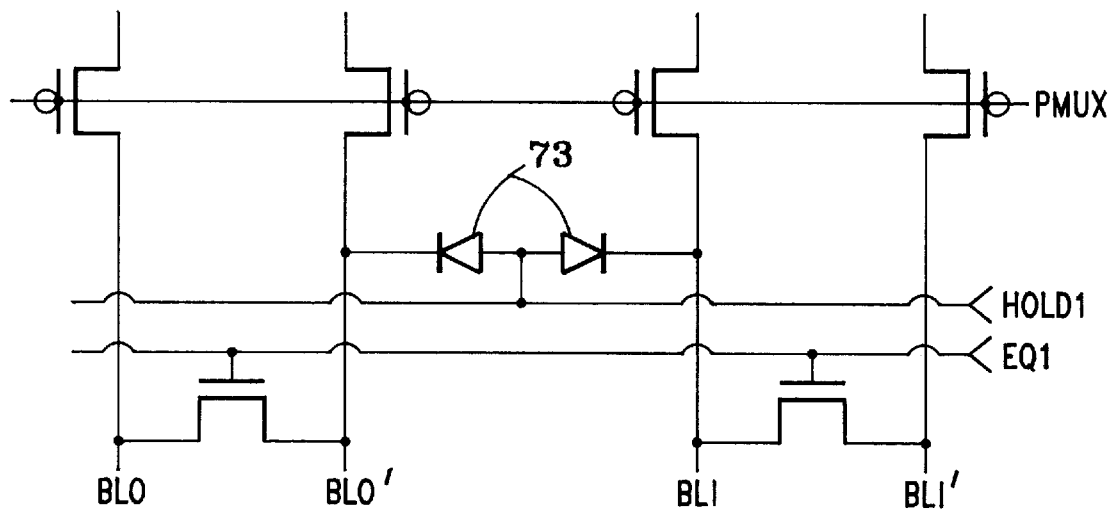

FIGS. 6c and 6d are schematic diagrams showing still other alternative implementations, in which clamping devices, i.e. NFETs 71 or diodes 73, are physically located to the exterior of each complementary pair of bitlines BL, BL'. As will be understood, each bitline BL, BL' of a complementary pair will be clamped by the particular NFET 71 which has a drain terminal connected to the bitline; or alternatively, by the diode 73 which has an n-terminal connected to the bitline.

Operation of the clamping circuit 60, and of clamping circuit 60b, (FIG. 6B) and the clamping devices shown in FIGS. 6c and 6d which are identical in operation, are described with reference to FIGS. 8a–8c. The voltage waveform applied to PMUXes 61 of the circuit shown in FIG. 6a is shown in FIG. 8a, which is the same as that applied to PMUXes 12 of the floating bitline circuit shown in FIG. 3. During precharge intervals 81, the voltage applied to the gates of PMUXes 61 is held at zero, during which time the EQ1 voltage level applied to the gate of equalization NFET 66 is raised to 2.5 V. During such precharge intervals, the HOLD1 voltage level applied to the tied together source and gate terminals of NFETs 62 and 64 is raised to 1.8 V. By operation of clamping circuit 60, the voltage levels on bitlines BL and BL' are raised and equalized to a precharge level of $V_{HOLD1}-V_{TN}$, i.e. approximately 1.2 V, in which the precharge level on each bitline BL or BL' depends on the threshold voltage $V_{TN}$ of respective NFETs 62, 64.

During sensing intervals 83, 85, the EQ1 waveform applied to equalization FET 66 is lowered to zero volts such that equalization is not performed. However, the HOLD1 waveform applied to NFETs 62, 64 is maintained at 0.9 V, which biases the NFETs 62, 64 to conduct whenever the voltage level on a bitline BL or BL' starts to fall below 0.3 V. Thus, if during a sensing interval, the voltage level 53 on a nonselected bitline begins to drop due to capacitive coupling of a voltage change on an adjacent bitline or because of leakage, NFETs 62, 64 turn on and restore the voltage level to 0.3 V.

Figure 7A:
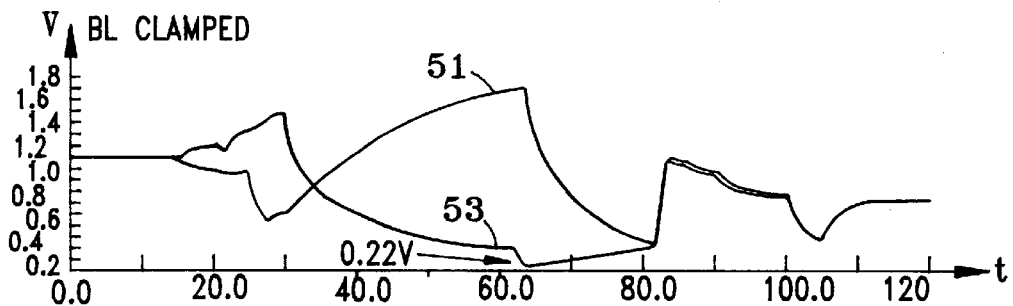
FIGS. 7a–7b correspond to FIGS. 4a–4b showing the unclamped bitline and illustrate the dynamic control effected over the voltage level of a nonselected bitline by the invention, for different values of adjacent bitline coupling capacitance.
Figure 7B:
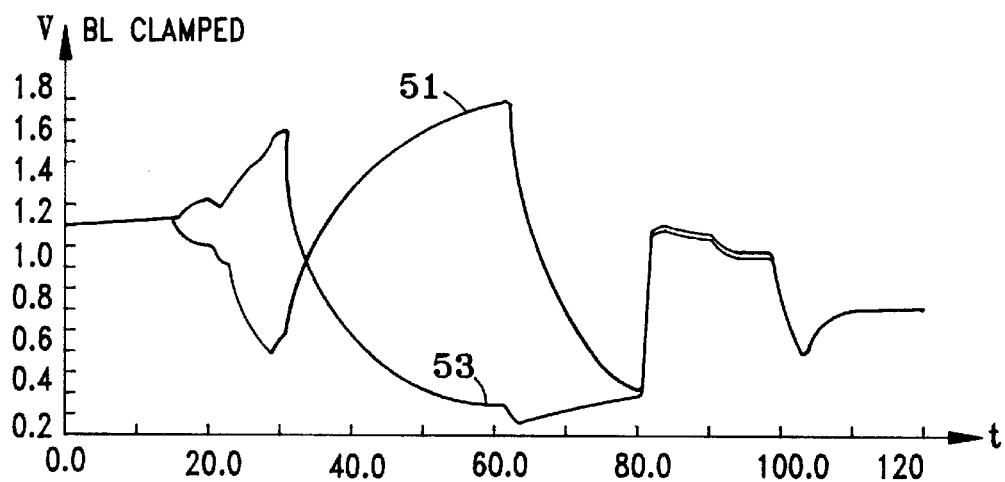
Figure 7C:
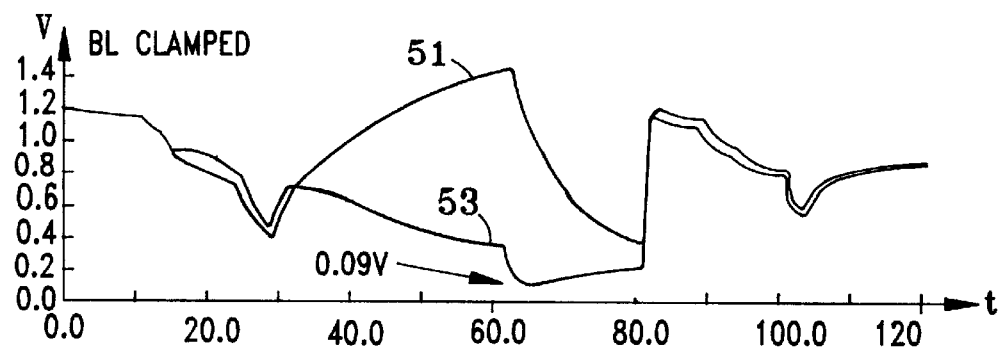
FIG. 7c corresponds to FIG. 4c showing the unclamped bitline and illustrates the dynamic control effected over the voltage level of a nonselected bitline by the invention, when higher than ordinary bitline leakage current is present.

FIGS. 7a–7c show examples of the voltage waveforms observed by operation of the clamping circuit 60 for respective coupling capacitance values: 50 fF (FIG. 7a); 200 fF (FIG. 7b); and 50 fF combined with a 500 kilo-ohm resistive leakage path to substrate (FIG. 7c). As indicated in FIGS. 7a–7b, whether the bitline coupling capacitance is 50 fF or 200 fF, the bitline voltage level 53 falls only momentarily to about 0.22 V and regains the 0.3 V level again by the end of the sensing interval. This contrasts with the operation of the circuit shown schematically in FIG. 3 in which the bitline voltage level 53 falls throughout the sensing interval, resulting in final voltage levels of 0.03 V with 50 fF coupling capacitance (FIG. 4a), and −0.22 V with 200 fF coupling capacitance (FIG. 4b).

As shown in FIG. 7c, when the coupling capacitance is 50 fF and there is a 500 kilo-ohm leakage path to the substrate, the clamping circuit 60 permits the voltage level 53 on the nonselected bitline to fall momentarily to about 0.1 V, but the voltage level quickly recovers again to about 0.2 V by the end of the sensing interval. This contrasts with the fall in the voltage level of the unclamped bitline for the same conditions, which, as shown in FIG. 4c, reaches a voltage level of −0.35 V.

Figure 9:
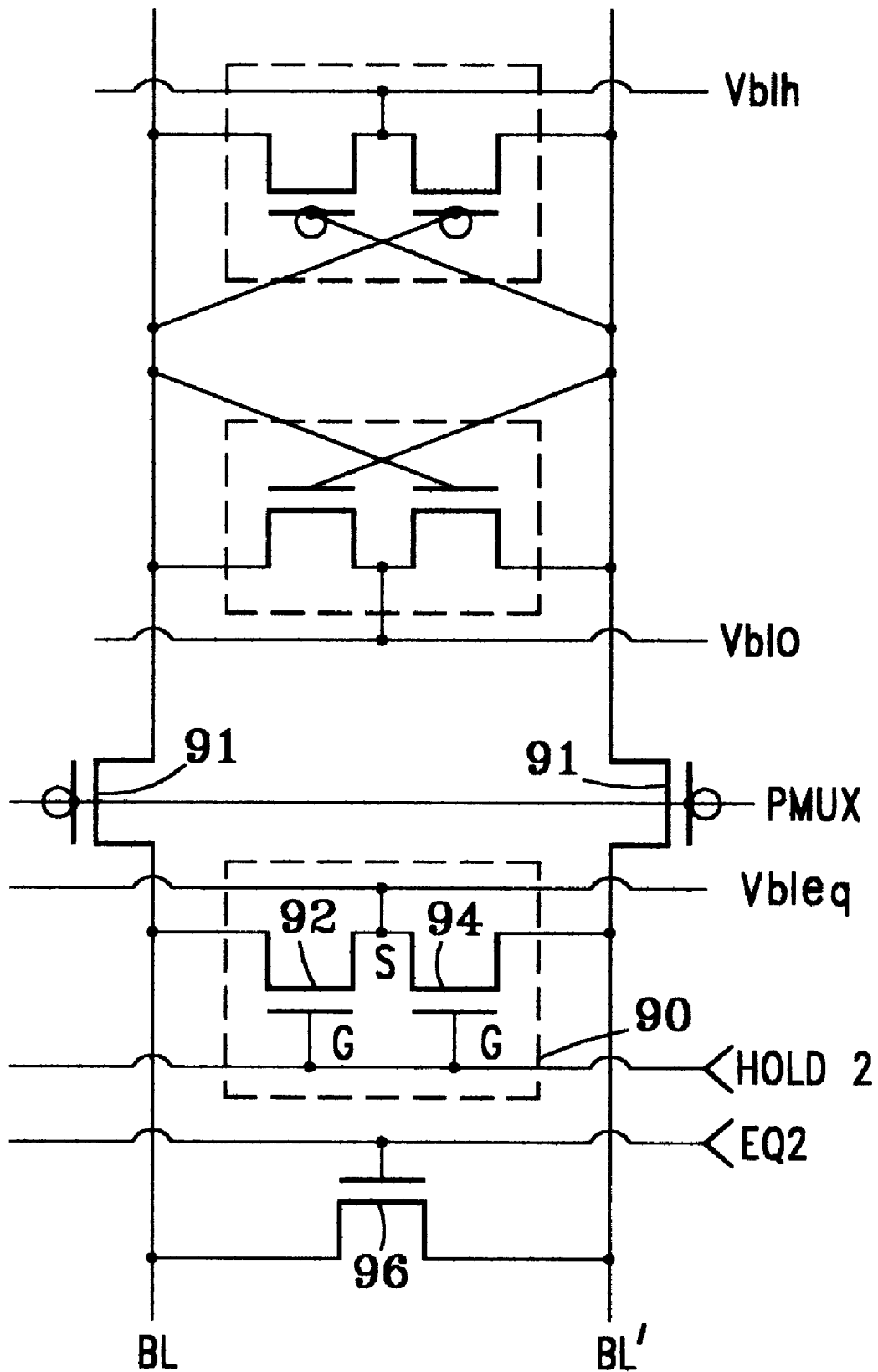
FIG. 9 is a schematic circuit diagram showing a second embodiment of the present invention.

FIG. 9 shows a schematic circuit diagram for a second embodiment of the invention. The second embodiment differs from the first embodiment in that the switches, for example NFETs 92, 94 of clamping circuit 90, are referenced to an external equalization voltage level $Vbl_{eq}$ (FIG. 8e) applied at the source terminals of NFETs 92, 94. Being so referenced, clamping circuit 90 is more immune to noise and to variations in device characteristics such as variation of threshold voltage $V_{TN}$ between NFETs 92, 94 than clamping circuit 60. In this embodiment, the switches, i.e. NFETs 92 and 94 have a dual function to 1) precharge bitlines BL and BL'; and 2) clamp the voltage level on bitlines BL and BL' at a voltage of $Vbl_{eq}$ minus the threshold voltage of the NFET 92 or 94. A third switch, for example an NFET 96, equalizes the voltage between bitlines BL and BL' when the waveform EQ2 applied thereto is raised to permit conduction.

FIGS. 8a and 8b show voltage waveforms applied to PMUXes 91 and NFET 96, respectively, which are the same voltage waveforms as those utilized by the first embodiment of the invention. FIG. 8d shows the HOLD2 voltage waveform which is applied to the gate terminals of NFETs 92, 94. As indicated, during sensing intervals, the HOLD2 waveform is reduced to 1.1 V which biases the NFETs 92, 94 to conduct current to a bitline BL or BL', and raise the voltage level thereon whenever the voltage level on the bitline falls below 0.3V.

Figure 10:
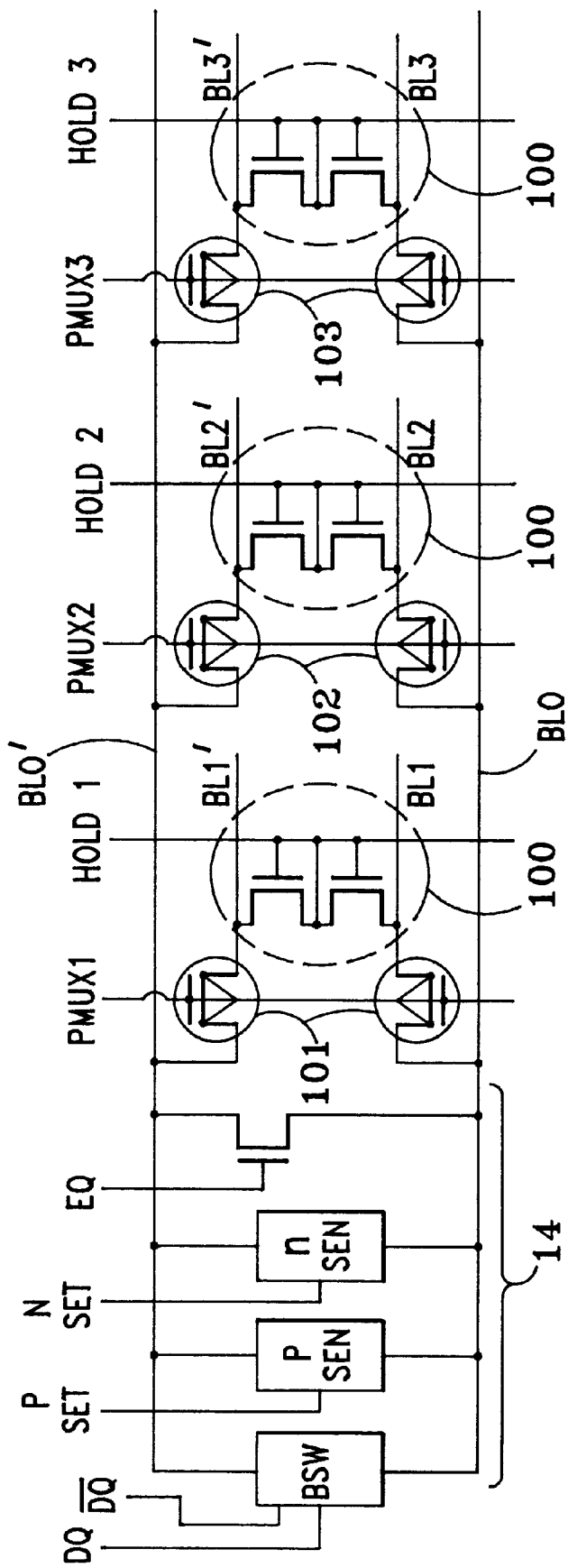
FIG. 10 is a schematic circuit diagram showing a third embodiment of the present invention.

FIG. 10 shows a schematic circuit diagram for a third embodiment of the invention in which bitlines are arranged hierarchically. In this embodiment, a master pair of bitlines BL0 and BL0' links each of several pairs of local bitlines BL1, BL1'; BL2, BL2'; BL3, BL3'; etc. by PMUXes 101, 102, and 103 to a sense amplifier 14. In such embodiment, when a particular pair of bitlines, for example BL3 and BL3', is selected for a read or write operation, a selecting voltage applied to the gates of the PMUX3 PMUXes 103, which electrically connects those bitlines to sense amplifier 14, while other pairs of local bitlines BL1, BL1'; and BL2, BL2' etc. remain electrically isolated from master bitlines BL0 and BL0' and sense amplifier 14. Conversely, a local bitline pair BL1, BL1' becomes electrically connected to sense amplifier 14 by a selecting voltage applied to the gates of PMUX1 PMUXes 101, at which time local bitline pairs: BL2, BL2', BL3, BL3' become electrically isolated from sense amplifier 14.

Because pairs of bitlines, e.g. BL1, BL1'; BL2, BL2' are electrically isolated from sense amplifier 14 when they are not selected by their respective PMUXes 101, 102, or 103, clamping circuits 100 are required to prevent the low voltage level on such floating bitlines from dwelling below a predetermined minimum bitline low voltage level.

Clamping circuits 100 can have the same structure as either of the clamping circuits 60, 60b, 60c, 60d, or 90 shown in FIGS. 6a and 6d. Referring to the foregoing description of the first and second embodiments of the invention, by operation of clamping circuits 100, the bitline low voltage level on local bitline pairs BL1, BL1'; BL2, BL2'; and BL3, BL3' etc. is clamped at a predetermined minimum voltage, for example 0.3 V. In this manner, the above-described problem of downward change in the floating bitline voltage level due to capacitive coupling from adjacent bitlines is overcome.

While the invention has been described with reference to certain preferred embodiments thereof, those skilled in the art will understand the many modifications and enhancements which can be made without departing from the true scope and spirit of the invention set forth in the appended claims.

We claim:

1. A semiconductor device, comprising:
   a memory cell comprising a storage capacitor and a single transistor;
   a bitline selectively directly connectable to said storage capacitor through said single transistor;
   a p-type field effect transistor multiplexer (PMUX) electrically isolating said bitline from a sense amplifier when a voltage on said bitline falls below a first voltage level; and
   a clamp coupled to said bitline at a location of said bitline electrically isolated from said sense amplifier by said PMUX, said clamp preventing said voltage from dwelling below a predetermined minimum voltage level.

2. The semiconductor storage device of claim 1 wherein said clamp receives a supply voltage and drives said voltage to a precharge voltage level in response to a change in said supply voltage.

3. The device according to claim 2 further comprising equalization means for stabilizing voltage levels on each bitline of a pair of adjacent said bitlines to a single said precharge voltage level during said precharge intervals.

4. The device of claim 1 wherein said first voltage level is a positive voltage above a deselecting voltage applied to a wordline connected to a control terminal of said single transistor to deselect said memory cell.

5. The device of claim 4 wherein said predetermined minimum voltage level is above said deselecting voltage.

6. A method of preventing a voltage on a bitline of a semiconductor storage device from remaining below a predetermined level, said bitline being selectively directly connectable to a storage capacitor of a memory cell by a single transistor of said memory cell, comprising the steps of:
   shifting a low voltage level output of a sense amplifier to a first voltage level for storing into said storage capacitor while electrically isolating said bitline from said sense amplifier when a voltage on said bitline falls below said first voltage level; and
   clamping said bitline to prevent said voltage from dwelling below a predetermined minimum voltage level.

7. The method of claim 6 further comprising the step of driving said voltage to a precharge voltage level during precharge intervals.

8. The method of claim 7 further comprising the step of equalizing said voltage with a voltage on a second bitline adjacent to said bitline to a single said precharge voltage level during said precharge intervals.

9. The method of claim 6 wherein said first voltage level is a positive voltage above a deselecting voltage applied to a wordline connected to a control terminal of said single transistor to deselect said memory cell.

10. The method of claim 9 wherein said predetermined minimum voltage level is above said deselecting voltage.

11. A device for preventing a voltage on a bitline of a memory array from remaining below a predetermined level, said bitline being selectively directly connectable to a storage capacitor of a memory cell of said memory array by a single transistor, comprising:
   a p-type field effect transistor multiplexer (PMUX) selectively electrically connecting said bitline to a sense amplifier, said PMUX transferring a low voltage level output of said sense amplifier on said bitline to said storage capacitor at a first voltage level while electrically isolating said bitline from said sense amplifier when a voltage on said bitline falls below said first voltage level; and
   a switch having an input connected to a supply voltage and an output connected to said bitline at a location electrically isolated from said sense amplifier by said PMUX, said switch being activated by a drop in voltage on said bitline to supply power thereto to prevent said voltage from remaining below a predetermined level.

12. The device of claim 11 wherein said supply voltage varies with time and said switch is further activated by a change in voltage level of said supply voltage to drive said voltage towards a precharge level.

13. The device of claim 12 further comprising an equalization switch having a first terminal connected to said bitline, a second terminal connected to a second bitline adjacent to said bitline and a control terminal adapted to receive an equalization control signal, said equalization switch causing voltages on said bitline and said second bitline to approach a single voltage level during active intervals of said equalization control signal.

14. The device of claim 13 wherein said active intervals of said equalization control signal coincide with said precharge intervals.

15. The device of claim 11 wherein said single transistor is an n-type field effect transistor (NFET) and said predetermined level is a positive voltage above a deselecting voltage applied to a wordline connected to a gate of said NFET when said wordline is deselected from accessing said storage capacitor.

16. The device of claim 11 wherein said switch consists of a semiconductor diode in which the p-terminal thereof forms said input and the n-terminal thereof forms said output.

17. The device of claim 11 wherein said switch consists of an n-type field effect transistor (NFET) in which the source forms said input, the drain forms said output and the gate is coupled to receive a hold control signal.

18. The device of claim 17 wherein said hold control signal varies with time and said switch is further activated by a change in said hold control signal to drive said voltage towards a precharge level.

19. The device of claim 18 further comprising an equalization NFET having a first terminal connected to said bitline, a second terminal connected to a second bitline adjacent to said first bitline and a control terminal adapted to receive an equalization control signal, said equalization NFET permitting voltages on said bitlines to approach a single level during active intervals of said equalization control signal.

20. The device of claim 19 wherein said active intervals of said equalization control signal coincide with said precharge intervals.

21. The device of claim 15 wherein said predetermined level is above said deselecting voltage.

22. A semiconductor memory device including a plurality of memory cells each containing a storage capacitor which stores a datum accessible from a bitline through a single transistor, comprising:

a plurality of local bitlines each selectively directly connectable to a storage capacitor of a memory cell through a single transistor;

at least one master bitline through which connection to a sense amplifier is made;

a plurality of p-type field effect transistor multiplexers (PMUXes), each selectively electrically connecting respective ones of said local bitlines to said master bitline, each said PMUX transferring a low voltage level output of said sense amplifier on said local bitline to a storage capacitor at a first voltage level while electrically isolating said local bitline from said sense amplifier when a voltage on said local bitline falls below said first voltage level;

for each said local bitline, a first switch having an input connected to a voltage supply and an output connected to said local bitline at a location electrically isolated from said sense amplifier by said PMUX, said first switch being activated by a drop in voltage on said local bitline to supply power thereto to prevent said voltage from remaining below a predetermined level.

* * * * *